US012751178B2

(12) United States Patent
Tang et al.

(10) Patent No.: US 12,751,178 B2
(45) Date of Patent: Sep. 29, 2026

(54) OLED DISPLAY PANEL AND PREPARATION METHOD THEREFOR

(71) Applicant: SHENZHEN CHINA STAR OPTOELECTRONICS SEMICONDUCTOR DISPLAY TECHNOLOGY CO., LTD., Guangming New District Shenzhen (CN)

(72) Inventors: Jia Tang, Guangming New District Shenzhen (CN); Xiaoxing Zhang, Guangming New District Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 604 days.

(21) Appl. No.: 18/077,763

(22) Filed: Dec. 8, 2022

(65) Prior Publication Data

US 2024/0147756 A1 May 2, 2024

(30) Foreign Application Priority Data

Nov. 1, 2022 (CN) ......................... 202211358665.0

(51) Int. Cl.
*H10K 59/80* (2023.01)
*H10K 50/16* (2023.01)
(Continued)

(52) U.S. Cl.
CPC ....... *H10K 59/80522* (2023.02); *H10K 50/16* (2023.02); *H10K 71/00* (2023.02);
(Continued)

(58) Field of Classification Search
CPC ...... H10K 50/824; H10K 71/00; H10K 50/16; H10K 59/1201; H10K 2102/351; H10K 59/17; H10K 59/12
See application file for complete search history.

(56) References Cited

U.S. PATENT DOCUMENTS

2006/0113900 A1* 6/2006 Oh ...................... H10K 59/131 313/504
2019/0115403 A1* 4/2019 Kang .................. H10D 86/441
(Continued)

FOREIGN PATENT DOCUMENTS

CN 107785381 A 3/2018
CN 109671739 A 4/2019
CN 112117357 A 12/2020

OTHER PUBLICATIONS

Chinese Office Action issued in corresponding Chinese Patent Application No. 202211358665.0 dated Jul. 18, 2025, pp. 1-7.

*Primary Examiner* — Jacob Y Choi
*Assistant Examiner* — Neil R Prasad
(74) *Attorney, Agent, or Firm* — PV IP PC; Christopher S. Ruprecht; Wei Te Chung

(57) ABSTRACT

An OLED display panel and a preparation method therefor are provided. The OLED display panel includes a substrate, an anode layer, an electron transport layer, and a cathode layer, wherein the anode layer includes an anode and an auxiliary electrode disposed in a same layer, and the auxiliary electrode is disposed in an overlapping area. The auxiliary electrode is provided with a groove, an opening of the groove is disposed toward the cathode layer, and the auxiliary electrode extends through the electron transport layer and is electrically connected with the cathode layer.

17 Claims, 4 Drawing Sheets

(51) Int. Cl.

| | |
|---|---|
| ***H10K 71/00*** | (2023.01) |
| *H10K 59/12* | (2023.01) |
| *H10K 59/131* | (2023.01) |
| *H10K 59/17* | (2023.01) |
| *H10K 102/00* | (2023.01) |

(52) U.S. Cl.

CPC ..... *H10K 59/1201* (2023.02); *H10K 59/1315* (2023.02); *H10K 59/17* (2023.02); *H10K 2102/351* (2023.02)

(56) References Cited

U.S. PATENT DOCUMENTS

| | | | | |
|---|---|---|---|---|
| 2019/0115561 | A1* | 4/2019 | Tang | H10D 86/441 |
| 2020/0127225 | A1* | 4/2020 | Zhang | H01L 21/77 |
| 2022/0384559 | A1* | 12/2022 | Zeng | H10K 59/122 |

* cited by examiner

OLED DISPLAY PANEL AND PREPARATION METHOD THEREFOR

CROSS-REFERENCE TO RELATED APPLICATIONS

This application claims the benefit of Chinese Patent Application No. 202211358665.0, filed on Nov. 1, 2022. The entire disclosure of the above application is incorporated herein by reference.

FIELD

The present disclosure relates to a technical field of display, and more particularly, to an OLED display panel and a preparation method for OLED display panel.

INTRODUCTION

This section provides background information related to the present disclosure which is not necessarily prior art.

A cathode layer and an electron transport layer cover different area. When vaporing and depositing the cathode layer and the electron transport layer of OLED display panel, two vapor deposition masks are currently used as a solution for mass production, i.e., a vapor deposition technology called two masks for Cathode/ET.

At present, in some OLED display panel, the electron transport layer is provided on an entire surface. Due to a poor conductivity of the electron transport layer, a conduction between the cathode layer and a metal layer of an underlying array substrate is affected. Thus, it is difficult to form a good electrical connection between the cathode layer and the metal layer of the underlying array substrate.

Therefore, the conventional OLED display panel has a technical problem of low yield when the electron transport layer covers the auxiliary electrode.

Technical Problems

Embodiments of the present disclosure provide an OLED display panel and a preparation method for OLED display panel, thereby alleviating a technical problem of low yield when an electron transport layer covers an auxiliary electrode in an OLED display panel.

SUMMARY

Embodiments of the present disclosure provide an OLED display panel and a preparation method for OLED display panel, thereby alleviating a technical problem of low yield when an electron transport layer covers an auxiliary electrode in an OLED display panel.

An embodiment of the present disclosure provides an OLED display panel including:

- a substrate;
- a second metal layer disposed on the substrate;
- an anode layer disposed on a side of the second metal layer away from the substrate, wherein the anode layer includes an anode and an auxiliary electrode disposed in a same layer, and the auxiliary electrode is disposed in an overlapping area;
- an electron transport layer disposed on a side of the anode layer away from the substrate; and
- a cathode layer disposed on a side of the electron transport layer away from the substrate;
- wherein the auxiliary electrode is provided with a groove, an opening of the groove is disposed toward the cathode layer, and the auxiliary electrode extends through the electron transport layer and is electrically connected to the cathode layer.

In some embodiments of the present disclosure, the auxiliary electrode further comprises a first auxiliary electrode disposed in a non-display area and a second auxiliary electrode disposed in a display area, wherein the cathode layer is electrically connected to the second metal layer through the first auxiliary electrode in the non-display area, and the second auxiliary electrode is electrically connected to the cathode in parallel in the display area.

In some embodiments of the present disclosure, the first auxiliary electrode has at least one first scratching chamfer structure, and the second auxiliary electrode has at least one second scratching chamfer structure, wherein the first scratching chamfer structure contacts with the cathode layer, and the second scratching chamfer structure contacts with the cathode layer.

In some embodiments of the present disclosure, the first auxiliary electrode is provided in a grid shape or in a separated arc shape.

In some embodiments of the present disclosure, the first auxiliary electrode has a cross-section of trapezoidal shape, an angle is defined between at least one inclined side of the trapezoidal shape and the substrate, and the angle ranges from 75° to 90°.

In some embodiments of the present disclosure, the groove comprises a first groove and a second groove, the first auxiliary electrode is provided with the first groove, the second auxiliary electrode is provided with the second groove, wherein a depth of the first groove is less than or equal to a thickness of the first auxiliary electrode, and a depth of the second groove is less than or equal to a thickness of the second auxiliary electrode.

In some embodiments of the present disclosure, the electron transport layer has a thickness of 10 nm to 20 nm.

In some embodiments of the present disclosure, the anode layer is disposed in a three-layer stacked structure.

An embodiment of the present disclosure provides a preparation method for OLED display panel, including:

- providing a substrate;
- preparing a second metal layer on the substrate;
- coating at least one layer of conductive material on a side of the second metal layer away from the substrate, patterning the conductive material to prepare an anode layer, wherein the anode layer includes an anode, and an auxiliary electrode disposed in an overlapping area, wherein a groove is provided on a side of the auxiliary electrode close to a cathode layer; and
- preparing an electron transport layer and the cathode layer sequentially on a side of the anode layer away from the substrate.

In some embodiments of the present disclosure, the preparing an electron transport layer and the cathode layer sequentially on a side of the anode layer away from the substrate further includes:

- preparing the electron transport layer and the cathode layer via a same mask.

Further areas of applicability will become apparent from the description provided herein. The description and specific examples in this summary are intended for purposes of illustration only and are not intended to limit the scope of the present disclosure.

BENEFICIAL EFFECTS

In the overlapping area of the conventional OLED display panel, the electron transport layer covers the auxiliary electrode to separate the auxiliary electrode from the cathode layer, hence the auxiliary electrode and the cathode layer have a poor conduction therebetween. In the present disclosure, grooves are provided on a surface of the auxiliary electrode close to the cathode layer, and thus, the auxiliary electrode extends through the electron transport layer and contacts with the cathode layer. It improves the conduction between the cathode layer and the auxiliary electrode, and thereby alleviating the technical problem that the conventional OLED display panel has a low yield when the electron transport layer covers the auxiliary electrode.

DRAWINGS

In order that the technical solution in the embodiments of the present disclosure may be explained more clearly, reference will now be made briefly to the accompanying drawings required for the description of the embodiments. It will be apparent that the accompanying drawings in the following description are merely some of the embodiments of the present disclosure, and other drawings may be made to those skilled in the art without involving any inventive effort.

DESCRIPTION OF REFERENCE NUMERALS

| | | | |
|---|---|---|---|
| 1 | OLED display panel | 2 | Display area |
| 3 | Non-display area | 4 | Light-emitting area |
| 5 | Non-light-emitting area | 10 | Substrate |
| 20 | Second metal layer | 30 | Passivation layer |
| 40 | Flat layer | 50 | Anode layer |
| 60 | Pixel defining layer | 70 | Light-emitting layer |
| 80 | Electron transport layer | 90 | Cathode layer |
| 100 | Groove | 110 | overlapping area |
| 120 | First scratching chamfer | $\alpha$ | First angle |
| 201 | Connecting electrode | 202 | Source |
| 501 | First auxiliary electrode | 502 | Second auxiliary electrode |
| 503 | Anode | 130 | Via hole |
| 5011 | First layer | 5012 | Second layer |
| 5013 | Third layer | | |

DETAILED DESCRIPTION

In the following, the technical solutions in the embodiments of the present disclosure will be clearly and completely described in connection with the accompanying drawings in the embodiments of the present disclosure. It will be apparent that the described embodiments are merely a part of the embodiments of the present disclosure, rather than all the embodiments. Based on the embodiments in the present disclosure, all other embodiments obtained by a person skilled in the art without involving any inventive effort are within the scope of the present disclosure. Furthermore, it is to be understood that the specific embodiments described herein are for purposes of illustration and explanation only and are not intended to limit the disclosure. In the present disclosure, if not stated to the contrary, the use of positional terms such as "above" and "down" usually refer to above and down of a device in actual use or a work state, specifically referring to the direction of the drawings. The terms such as "in" and "out" are usually for the profile of the device.

Figure 1:
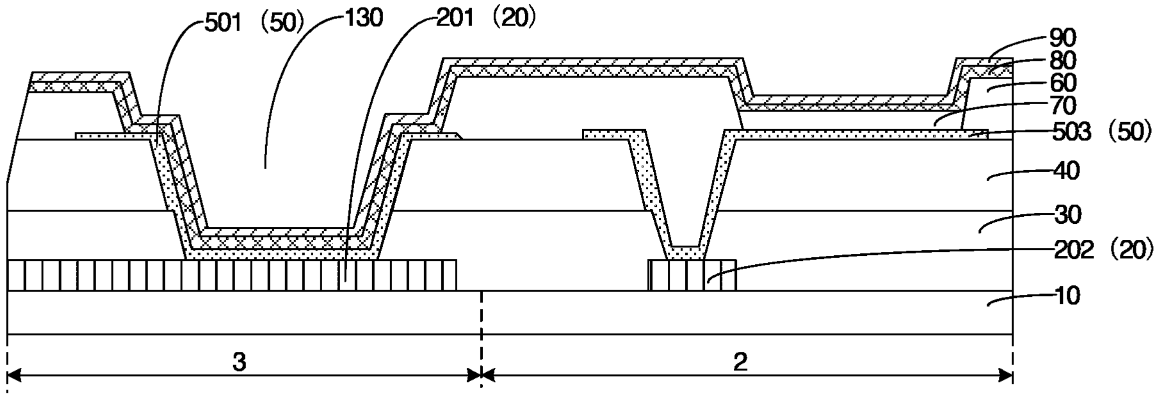
FIG. 1 is a schematic cross-sectional diagram of a conventional OLED display panel.

In a conventional OLED display panel 1, particularly in an overlapping area of a non-display area 3, referring to FIG. 1, an electron transport layer 80 and a cathode layer 90 share a mask, wherein the electron transport layer 80 having a poor conductivity separates the cathode layer 90 from a first auxiliary electrode 501. As such, a conduction between the first auxiliary electrode 501 and the cathode layer 90 is affected, and a data signal or the like cannot be or is difficult to be transferred from a second metal layer 20 of the non-display area 3 to the cathode layer 90, thereby reducing a yield of the conventional OLED display panel 1.

It should be understood that, as a vapor deposition technology called two masks for Cathode/ET, referring to FIG. 1, the electron transport layer 80 is completely vapored and deposited on an overlapping area 110, and the auxiliary electrode 501 and the cathode layer 90 are not directly contacted. Since the electron transport layer 80 is not a good conductor, the conduction between the cathode layer 90 and the auxiliary electrode 501 is poor. Further, the conduction between the cathode layer 90 and the second metal layer 20 is poor. In the present disclosure, a vapor deposition technology called one mask for Cathode/ET is used, that is, referring to FIG. 2, the electron transport layer 80 and the cathode layer 90 are prepared by sharing a same photomask, and the electron transport layer 80 and the cathode layer 90 are both vapored and deposited on an entire surface. Compared with a vapor deposition technology called two masks for Cathode/ET, one mask for preparing the electron transport layer is saved. A groove 100 is provided on a side of the auxiliary electrode 501 close to the electron transport layer 80, and an edge around the groove easily extends through the electron transport layer 80. As such, the auxiliary electrode 501 contacts with the cathode layer 90, thereby improving the conduction between the cathode layer 90 and the second metal layer 20. It should be understood that the overlapping area refers to: an area where the cathode layer 90 overlaps with the auxiliary electrode in a film thickness direction.

Referring to FIGS. 2 to 9, the technical solution of the present disclosure will now be described with specific embodiments.

Figure 2:
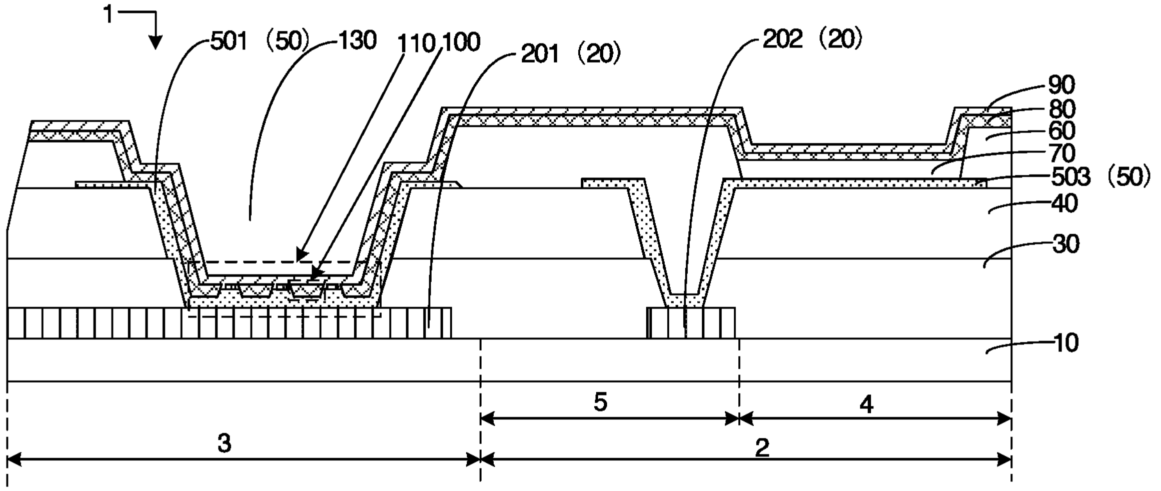
FIG. 2 is a first schematic cross-sectional diagram of an OLED display panel according to the present disclosure.

Referring to FIG. 2, an OLED display panel 1 includes a display area 2 and the non-display area 3, wherein the display area 2 and the non-display area 3 include an overlapping area 110. The display area 2 includes a light-emitting area 4 and a non-light-emitting area 5. The OLED display panel 1 includes a substrate 10, a second metal layer 20, a passivation layer 30, a flat layer 40, an anode layer 50, a pixel defining layer 60, a light-emitting layer 70, an electron transport layer 80, and a cathode layer 90. The second metal layer 20 is disposed on the substrate 10. The passivation layer 30 is provided on a side of the second metal layer 20 away from the substrate 10, a flat layer 40 is provided on a side of the passivation layer 30 away from the substrate 10, and the anode layer 50 is provided on a side of the flat layer 40 away from the substrate 10. The pixel defining layer 60 is disposed on a side of the anode layer 50 away from the substrate 10, and a light-emitting layer 70 is provided in the light-emitting area 4 between adjacent pixel defining layers 60. The electron transport layer 80 is disposed on a side of the anode layer 50 away from the substrate 10. The anode layer 50 includes a first auxiliary electrode 501 in the non-display area 3, a second auxiliary electrode 502 (referring to FIG. 8) in the display area 2, and an anode 503, wherein the first auxiliary electrode 501 and the second auxiliary electrode 502 are disposed on the overlapping area 110. The electron transport layer 80 at least partially covers the first auxiliary electrode 501 and the second auxiliary electrode 502. The cathode layer 90 is disposed on a side of the electron transport layer 80 away from the substrate 10. A groove 100 is provided on the auxiliary electrode 501, and an opening of the groove 100 is disposed toward the cathode layer 90.

It should be understood that, in an area where the first auxiliary electrode 501 is provided with the groove 100, there is a boss structure defined between two adjacent grooves 100. There is a level difference between the top of the boss structure and the bottom of the groove 100. The boss structure has a taper angle, and the edge around the groove 100 (i.e. the edge of the top of the boss structure) is formed with a scratching chamfer, as shown by sign 120 FIG. 6. Due to the scratching chamfer, the edge easily extends through the electron transport layer 80 or easily extends through the electron transport layer 80 under an external electric field, and the first auxiliary electrode 501 electrically connects the cathode layer 90.

Figure 6:
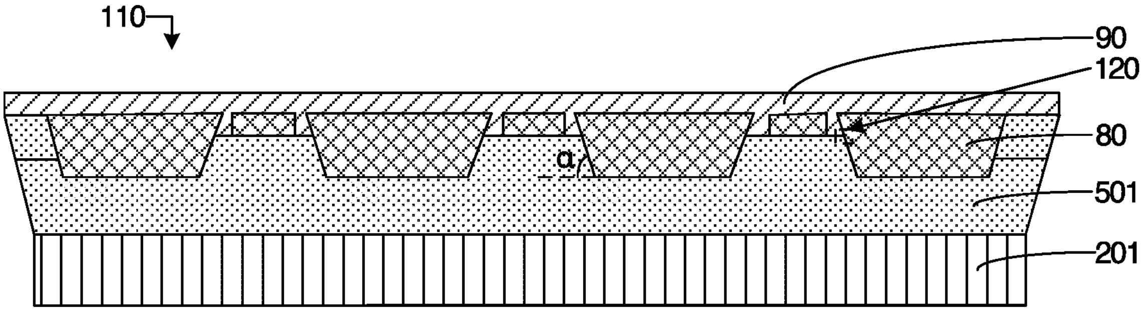
FIG. 6 is a schematic enlarged diagram of an overlapping area 110 of an OLED display panel according to the present disclosure.

As such, in the overlapping area 110, referring to FIG. 2 and FIG. 6, a first part of the cathode layer 90 is in surface contact with the electron transport layer 80, and the first part of the cathode layer 90 is not in contact with the first auxiliary electrode 501. A second part of the cathode layer 90 is in contact with the first auxiliary electrode 501 extending through the electron transport layer 80. The second part of the cathode layer 90 is conducted with the first auxiliary electrode 501, thereby improving the conduction between the cathode layer 90 and the first auxiliary electrode 501.

It should be understood that, referring to FIG. 6, the first auxiliary electrode 501 is disposed in a same layer as the anode layer 50, and the taper angle of the boss structure in the anode layer 50 is relatively large, wherein the taper angle is an angle $\alpha$ shown in FIG. 6. A thickness of the electron transport layer 80 is relatively thin. As such, the first auxiliary electrode 501 with a scratching chamfer has a relatively high probability of extending through the electron transport layer 80 during the preparation of the electron transport layer 80 or the energization of the substrate 10 or the OLED display panel. Thus, the auxiliary electrode 501 contacts with the cathode layer 90, thereby improving the conduction. Further, the angle $\alpha$ is greater than 750 and less than or equal to 90°.

In the present embodiment, referring to FIG. 2 and FIG. 6, by providing the groove 100 on the surface of the first auxiliary electrode 501 close to the cathode layer 90, the first auxiliary electrode 501 extends through the electron transport layer 80 and contacts with the cathode layer 90, thereby improving the conduction between the cathode layer 90 and the first auxiliary electrode 501, and alleviating the technical problem that the conventional OLED display panel has a low yield when the electron transport layer covers the auxiliary electrode.

In an embodiment, referring to FIG. 2, the second metal layer 20 includes a connecting electrode 201, and a source 202 connected to the anode 503. The connecting electrode 201 is disposed in the overlapping area 110, an end of the connecting electrode 201 is supplied with an external signal, and another end of the connecting electrode 201 is electrically connected to the cathode layer 90 through the first auxiliary electrode 501.

Herein, in the overlapping area 110 of the non-display area 3, the cathode layer 90 is electrically connected to the connecting electrode 201 through the first auxiliary electrode 501, so that the external signal can be transmitted to the display surface through the cathode layer 90.

The first auxiliary electrode 501 may serve as a transition electrode, wherein a side of the first auxiliary electrode 501 is connected to the cathode layer 90, and another side of the first auxiliary electrode 501 is connected to the connecting electrode 201. In an embodiment, the first auxiliary electrode 501 is continuously provided, and a side of the first auxiliary electrode 501 close to the substrate 10 is in surface contact with the connecting electrode 201.

In an embodiment, referring to FIG. 2, the overlapping area 110 has a via hole 130, wherein the via hole 130 extends through the passivation layer 30, the flat layer 40, and the pixel defining layer 60. The first auxiliary electrode 501 is disposed in the via hole 130, wherein the via hole 130 includes an inclined inner wall. When the cathode layer 90 is vapored and deposited, the cathode layer 90 is prone to occurrence of abnormalities such as wire breakage or the like on the inclined inner wall of the via hole 130. The first auxiliary electrode 501 is prepared in a same layer as the anode layer 50, the thickness of the first auxiliary electrode 501 is same as that of the anode layer 50, and the thickness of the first auxiliary electrode 501 is larger than that of the cathode layer 90. The first auxiliary electrode 501 with a larger thickness is not prone to wire breakage in the via hole. Even if the cathode layer 90 is broken in the via hole, the first auxiliary electrode 501 can be provided as a transition electrode to repair the cathode layer. Both ends of the first auxiliary electrode 501 are respectively connected to both ends of the cathode layer 90 where the wire breakage occurs, thereby avoiding abnormal connection between the cathode layer 90 and the second metal layer 20 due to the wire breakage.

Further, the first auxiliary electrode 501 at least covers where abnormal connection such as the wire breakage of the cathode layer 90, and the first auxiliary electrode 501 is continuously provided in the via hole 130. Even if the cathode layer 90 is broken in the via hole 130 of the overlapping area 110, the cathode layer 90 can still be in a continuous surface contact with the connecting electrode 201 through the first auxiliary electrode 501, thereby achieving a good electrical connection.

In the present embodiment, a continuous first auxiliary electrode 501 is provided in the overlapping area 110 of the non-display area 3, so that the cathode layer 90 and the connecting electrode 201 are electrically connected through the first auxiliary electrode 501, thereby avoiding abnormal electrical connection caused by the wire breakage of the cathode layer.

Figure 3:
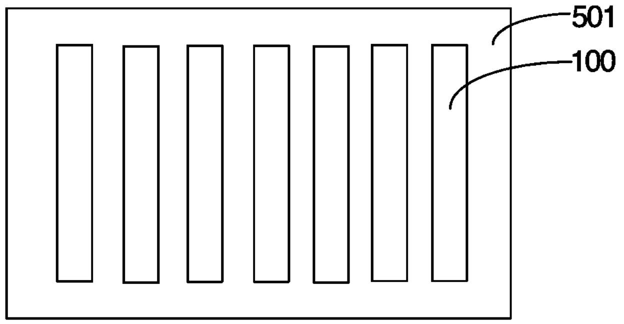
FIG. 3 is a first schematic cross-sectional diagram of a first auxiliary electrode of an OLED display panel according to the present disclosure.
Figure 4:
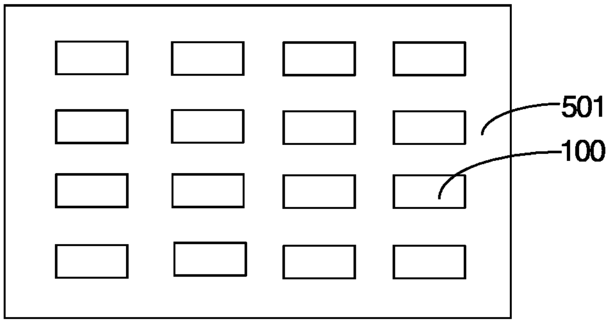
FIG. 4 is a second schematic cross-sectional diagram of a first auxiliary electrode of an OLED display panel according to the present disclosure.
Figure 5:
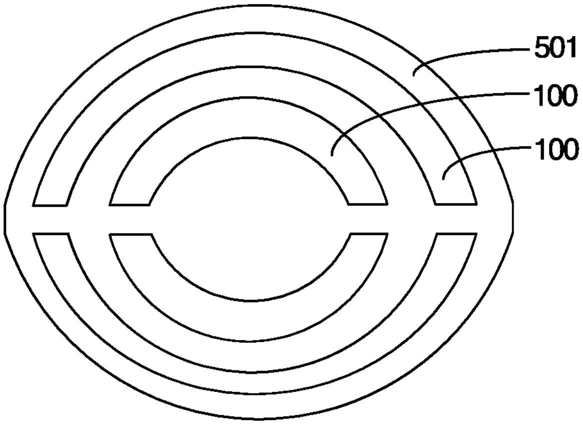
FIG. 5 is a third schematic cross-sectional diagram of a first auxiliary electrode of an OLED display panel according to the present disclosure.

In an embodiment, referring to FIGS. 3, 4, and 5, the first auxiliary electrode 501 is provided in a grid shape or in a separated arc shape, wherein the separated arc shape has a trunk and a plurality of arc branches extending from the trunk, and the arc branches are separated from each other.

In an embodiment, the depth of the groove may be less than the thickness of the first auxiliary electrode 501. This is, the first auxiliary electrode 501 is provided continuously.

In an embodiment, the depth of the groove may be equal to the thickness of the first auxiliary electrode. This is, the first auxiliary electrode 501 is discontinued by the groove, and a hollow area is formed by the groove. The first auxiliary electrode 501 includes a plurality of hollow areas. In a grid shape, the hollow areas may be disposed in an array. In a separated arc shape, the hollow areas may be disposed between adjacent arc branches.

It should be understood that by hollowing out the groove in the first auxiliary electrode 501, the level difference can be further increased, and the probability of the first auxiliary electrode 501 extending through the electron transport layer 80 can be increased.

In the present embodiment, the probability that the first auxiliary electrode 501 extends through the electron transport layer 80 is further increased by defining the depth and the arrangement form of the groove in the first auxiliary electrode 501, thereby improving the conduction between the cathode layer 90 and the connecting electrode 201.

In an embodiment, the anode layer 50 is provided in a three-layer stacked structure, and the first auxiliary electrode 501 is also provided in a three-layer stacked structure.

Herein, the anode layer 50 may have a three-layer structure of titanium, silver, and indium tin oxide, wherein the titanium may be used as a hydrogen absorbing material to prevent hydrogen atoms from diffusing into the underlying TFT device, thereby improving the stability of the TFT device.

Figure 7:
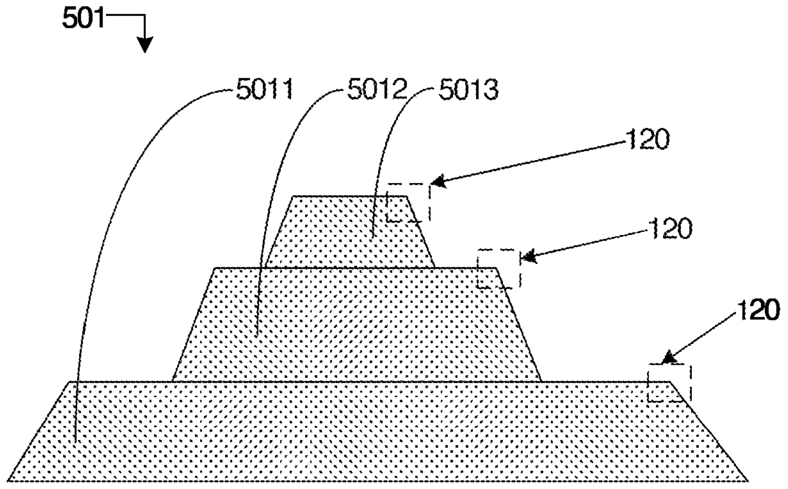
FIG. 7 is a schematic cross-sectional diagram of a three-layer structure of a first auxiliary electrode of an OLED display panel according to the present disclosure.

In an embodiment, referring to FIG. 7, the first auxiliary electrode 501 is provided in a three-layer stacked structure, i.e., a first layer 5011, a second layer 5012, and a third layer 5013. The groove is provided in the first layer 5011, the second layer 5012, and the third layer 5013, respectively. The edge around the groove at each layer is easily to form a scratching chamfer. Specifically, a first scratching chamfer 120 is easily formed at a position where the level difference is defined or unevenness between two adjacent layers of the first auxiliary electrode 501. The first scratching chamfer 120 can contribute to the first auxiliary electrode 501 extending through the electron transport layer 80, thereby increasing the probability that the first auxiliary electrode 501 extends through the electron transport layer 80.

It should be understood that the three-layer stacked structure has a large thickness and a steep side, thereby facilitating the first auxiliary electrode 501 extending through the electron transport layer 80 to contact with the cathode layer 90.

In the present embodiment, by providing the first auxiliary electrode 501 as a three-layer stacked structure, the probability of forming the first scratching chamfer is increased, thereby increasing the probability that the first auxiliary electrode 501 extends through the electron transport layer 80, and improving the conduction between the cathode layer 90 and the connecting electrode 201.

In an embodiment, referring to FIG. 6, the three-layer stacked structure of the first auxiliary electrode 501 has at least one first scratching chamfer 120, wherein the first scratching chamfer 120 contacts with the cathode layer 90. The first auxiliary electrodes 501 may include at least two first scratching chamfers 120, wherein at least one of the first scratching chamfers 120 contacts with the cathode layer 90.

Herein, the conduction between the cathode layer 90 and the connecting electrode 201 is improved by the first scratching chamfer 120 extending through the electron transport layer 80.

It should be understood that, when the first auxiliary electrode 501 is a three-layer stacked structure, it is possible to have more first scratching chamfers than a single-layer structure. By increasing the number of the first scratching chamfers 120, the cathode layer has more contacts with the first scratching chamfers 120. Due to more contacts between the cathode layer and the first scratching chamfers 120, the contact area between the first auxiliary electrode 501 and the cathode layer 90 can be increased, thereby reducing the impedance of the cathode layer 90.

In the present embodiment, the contact area between the first auxiliary electrode 501 and the cathode layer 90 is advantageously increased by a plurality of first scratching chamfers 120 formed at the edges around the three-layer stacked structure of the first auxiliary electrode 501. The impedance of the cathode layer 90 can be reduced based on the fact that the contact area is inversely proportional to the impedance.

In an embodiment, referring to FIG. 6, the boss structure of the first auxiliary electrode 501 has a cross-section of trapezoidal shape, wherein a first angle α is defined between at least one inclined side of the trapezoidal shape and the substrate 10, and the first angle α ranges from 750 to 90°.

The first angle α is a taper angle of the boss structure of the first auxiliary electrode 501.

It should be understood that, when the first angle α defined between at least one inclined side of the trapezoidal shape and the substrate 10 ranges from 75° to 90°, the side of the trapezoidal shape is steeper, and the first auxiliary electrode 501 extends through the electron transport layer 80 to contact with the cathode layer 90.

Preferably, the first angle α may be 750 or 90°, wherein 750 and 900 are endpoints of the range of the first angle α. If the first angle α is less than 750 or greater than 90°, the side of the trapezoidal shape of the first auxiliary electrode 501 is not steep enough, and it is difficult for the first auxiliary electrode 501 to extend through the electron transport layer 80 and to contact with the cathode layer 90. Alternatively, the first angle α may be 80°.

In this embodiment, by specifically defining the trapezoidal shape of the first auxiliary electrode 501 and the taper angle α, the probability that the first auxiliary electrode 501 extends through the electron transport layer 80 is further increased.

Figure 8:
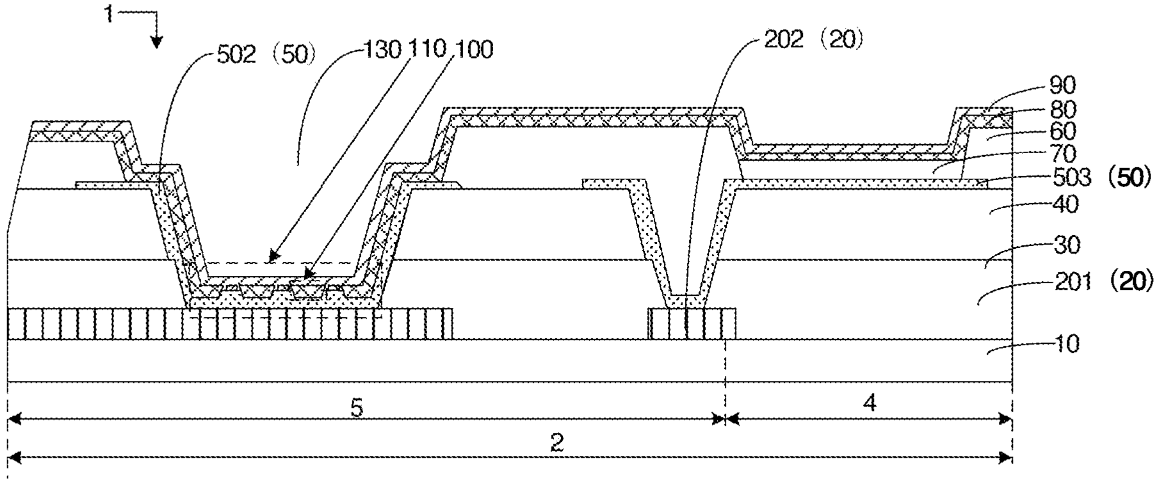
FIG. 8 is a second cross-sectional diagram of an OLED display panel according to the present disclosure.

In an embodiment, referring to FIG. 8, the second auxiliary electrode 502 is disposed in the display area 2, and the second auxiliary electrode 502 is connected in parallel with the cathode layer 90.

In the overlapping area 110 of the display area 2, the second auxiliary electrode 502 is electrically connected in parallel with the cathode layer 90 to reduce the impedance of the cathode layer 90, instead of serving as a transition electrode as the first auxiliary electrode 501. That is, the functions and usages of the first auxiliary electrode 501 and the second auxiliary electrode 502 are different, and the positions of the first auxiliary electrode 501 and the second auxiliary electrode 502 are different. The effect on overlapping the cathode layer 90 and the first auxiliary electrode 501 in the overlapping area 110 of the display area 2 is different from that the effect on overlapping the cathode layer 90 and the second auxiliary electrode 502 in the overlapping area 110 of the non-display area 3.

Referring to FIG. 8, the second auxiliary electrode 502 and the light-emitting area 4 may be in a one-to-one correspondence, or one second auxiliary electrode 502 may be corresponding to a plurality of the light-emitting areas 4. The impedance of the second auxiliary electrode 502 may be less than the impedance of the cathode layer 90. The impedance of the second auxiliary electrode 502 may be less than the impedance of the first auxiliary electrode 501.

In an embodiment, the groove comprises a first groove (referring to the groove 100 shown in FIG. 2) and a second groove (referring to the groove 100 shown in FIG. 8), wherein the first auxiliary electrode 501 is provided with the first groove 100, as shown in FIG. 2; the second auxiliary electrode 502 is provided with the second groove 100, as shown in FIG. 8. Referring to FIG. 8, the cathode layer 90 may be connected to the second auxiliary electrode 502 by undercutting the second groove 100 which is similar with the first groove 100 shown in FIG. 2 and FIG. 6. A depth of the first groove is less than or equal to a thickness of the first auxiliary electrode 501, and a depth of the second groove is less than or equal to a thickness of the second auxiliary electrode 502.

It should be understood that the second auxiliary electrode 502 is electrically connected in parallel with the cathode layer 90, and the impedance of the second auxiliary electrode 502 is relatively small. According to the calculation formula of the total impedance in parallel, the total impedance of the cathode in parallel connection is less than the total impedance of the second auxiliary electrode 502, thereby greatly reducing the impedance of the cathode layer 90, and alleviating a technical problem that a large signal loss is caused by a large voltage drop of the cathode layer 90.

It should be understood that the second auxiliary electrodes 502 may be arranged in an array in a plane. Specifically, the display area 2 may be divided into a plurality of impedance areas to be reduced, and each of the impedance areas to be reduced is provided with a second auxiliary electrode 502 electrically connected to the cathode layer 90. As such, the voltage drop of each segment of the cathode layer 90 is better reduced, and the voltage drop of each area in the plane is more uniform, thereby ensuring uniformity of brightness.

In the present embodiment, the second auxiliary electrode 502 is provided in the display area 2, and the second auxiliary electrode 502 is connected to the cathode layer 90, and thereby reducing the voltage drop of the cathode layer 90. It is prevented the display panel from being uneven in brightness due to large signal loss of the cathode layer 90.

In an embodiment, the second auxiliary electrode 502 is provided in a grid shape or in a separated arc shape, wherein the separated arc shape has a trunk and a plurality of arc branches extending from the trunk, and the arc branches are separated from each other. As similar example of first auxiliary electrode 501 shown in FIGS. 3, 4, and 5.

In an embodiment, the depth of the second groove may be less than the thickness of the second auxiliary electrode 502. This is, the second auxiliary electrodes 502 is provided continuously.

In an embodiment, the depth of the second groove may be equal to the thickness of the second auxiliary electrode 502. This is, the second auxiliary electrode 502 is discontinued by the second groove, and a hollow area is formed by the second groove. The second auxiliary electrode 502 includes a plurality of hollow areas. In a grid shape, the hollow areas may be disposed in an array. In a separated arc shape, the hollow areas may be disposed between adjacent arc branches.

It should be understood by hollowing out the second groove in the second auxiliary electrode 502, the level difference can be further increased, and the probability of the second auxiliary electrode 502 extending through the electron transport layer 80 can be increased.

In the present embodiment, by defining the depth and the arrangement form of the second groove in the second auxiliary electrode 502, the probability that the second auxiliary electrode 502 extends through the electron transport layer 80 is further increased, thereby improving the conduction between the cathode layer 90 and the connecting electrode 201.

In an embodiment, the anode layer 50 is provided in a three-layer stacked structure, and the second auxiliary electrode 502 is also provided in a three-layer stacked structure.

Herein, the anode layer 50 may have a three-layer structure of titanium, silver, and indium tin oxide, wherein the titanium may be used as a hydrogen absorbing material to prevent hydrogen atoms from diffusing into the underlying TFT device, thereby improving the stability of the TFT device.

It should be understood that the second auxiliary electrode 502 is provided in a three-layer stacked structure, similar with the example of the first auxiliary electrode 501 as shown in FIG. 7. The edge around the second groove in the second auxiliary electrode 502 at each layer is easily to form a scratching chamfer. Specifically, a second scratching chamfer (similar with the example of the first scratching chamfer 120 shown in FIG. 2 and FIG. 6) is easily formed at a position where the level difference is defined or unevenness between two adjacent layers of the second auxiliary electrode 502. The second scratching chamfer can contribute to the second auxiliary electrode 502 extending through the electron transport layer 80, thereby increasing the probability that the second auxiliary electrode 502 extends through the electron transport layer 80.

It should be understood that the three-layer stacked structure has a large thickness and a steep side, thereby facilitating the second auxiliary electrode 502 extending through the electron transport layer 80 to contact with the cathode layer 90.

In the present embodiment, by providing the second auxiliary electrode 502 as a three-layer stacked structure, the probability of forming the second scratching chamfer is increased, thereby increasing the probability that the second auxiliary electrode 502 extends through the electron transport layer 80, and improving the conduction between the cathode layer 90 and the connecting electrode 201.

In an embodiment, the three-layer stacked structure of the second auxiliary electrode 502 has at least one second scratching chamfer, wherein the second scratching chamfer contacts with the cathode layer 90. The second auxiliary electrodes 502 may include at least two second scratching chamfer, wherein at least one of the second scratching chamfer contacts with the cathode layer 90. Similar with the example of the first scratching chamfer 120 shown in FIG. 7.

Herein, the conduction between the cathode layer 90 and the connecting electrode 201 is improved by the second scratching chamfer extending through the electron transport layer 80.

It should be understood, that the impedance of the cathode layer 90 can be reduced by increasing the number of the second scratching chamfers, and further by increasing the contact area between the second scratching chamfer and the cathode layer 90.

In the present embodiment, the contact area between the second auxiliary electrode 502 and the cathode layer 90 is advantageously increased by a plurality of second scratching chamfers formed at the edge around the three-layer stacked structure of the second auxiliary electrode 502. The impedance of the cathode layer 90 can be reduced based on the fact that the contact area is inversely proportional to the impedance.

In an embodiment, the second auxiliary electrode 502 has a cross-section of trapezoidal shape, wherein a second angle is defined between at least one inclined side of the trapezoidal shape and the substrate 10, and the second angle ranges from 750 to 90°.

It should be understood that, when the second angle defined between at least one inclined side of the second auxiliary electrode 502 and the substrate 10 ranges from 75° to 90°, the side of the second auxiliary electrode 502 is steeper, and the second auxiliary electrode 502 extends through the electron transport layer 80 to contact with the cathode layer 90. Alternatively, the second angle may be 75°, 80°, and 90°.

In the present embodiment, by specifically defining the shape of the second auxiliary electrode 502 and the taper angle, the probability that the second auxiliary electrode 502 extends through the electron transport layer 80 is further increased.

In an embodiment, the electron transport layer 80 has a thickness ranging from 10 nm to 20 nm.

Preferably, the electron transport layer 80 has a thickness of 10 nm. By reducing the thickness of the electron transport layer 80, it is convenient for the auxiliary electrode to extend through the electron transport layer 80, so that the auxiliary electrode contacts with the cathode layer 90 and is conductive. The thickness of the electron transport layer 80 may also be 15 nm or 20 nm, which is not specifically limited in the present disclosure.

In the present embodiment, the electron transport layer 80 has a thin thickness, which facilitates the auxiliary electrode to extend through the electron transport layer 80 and further to contact with the cathode layer 90, thereby increasing the yield of the OLED display panel 1.

Figure 9:
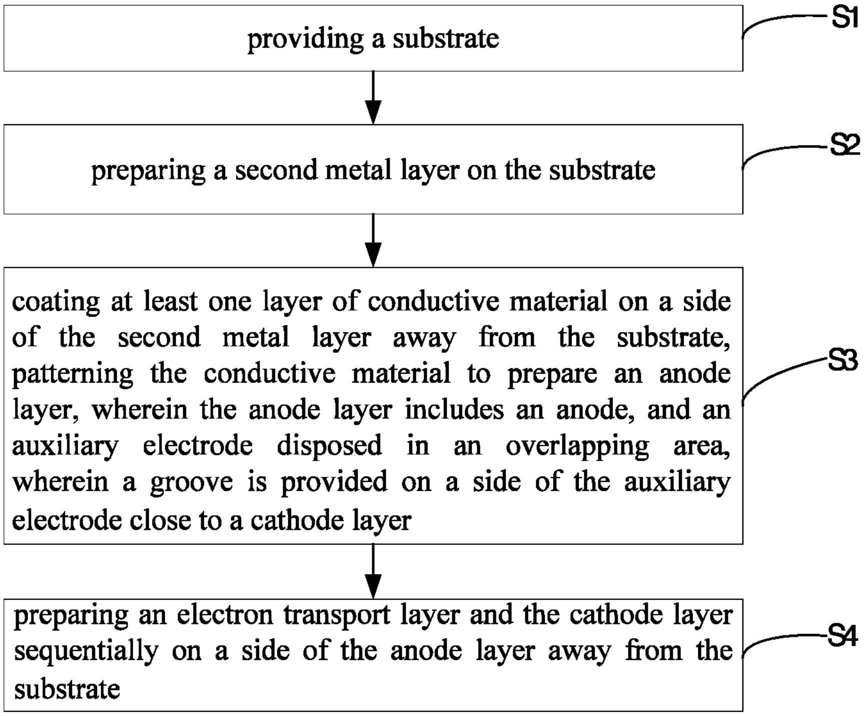
FIG. 9 is a flow block of a preparation method for OLED display panel according to the present disclosure.

Referring to FIG. 9, an embodiment of the present disclosure provides a preparation method for OLED display panel 1, including:

S1: providing a substrate 10;

S2, preparing a second metal layer 20 on the substrate 10;

S3, coating at least one layer of conductive material on a side of the second metal layer 20 away from the substrate 10, patterning the conductive material to prepare an anode layer 50, wherein the anode layer 50 includes an anode 503, and an auxiliary electrode disposed in an overlapping area 110, wherein a groove 100 is provided on a side of the auxiliary electrode close to a cathode layer 90; and S4, preparing an electron transport layer 80 and the cathode layer 90 sequentially on a side of the anode layer 50 away from the substrate 10.

It should be understood that, when the electron transport layer 80 is prepared on the side of the anode layer 50 away from the substrate 10, the electron transport layer 80 is discontinuously provided, and the electron transport layer 80 is disconnected at the position where the auxiliary electrode is provided.

Further, the electron transport layer 80 has a thinner thickness, and the auxiliary electrode is prepared in the same layer as the anode layer 50. Since the anode layer 50 and the auxiliary electrode have a thicker thickness and easily form with a plurality of scratching chamfers, the auxiliary electrode easily extends through the electron transport layer 80 and contacts with the cathode layer 90.

In an embodiment, the step of preparing the anode layer 50 further includes: coating two layers of metal material and one layer of indium tin oxide material on a side of the second metal layer 20 away from the substrate 10, patterning the three layers to prepare the anode layer 50 having a three-layer stacked structure.

The two layers of the metal material may be a titanium layer provided close to the substrate 10 and a copper layer provided on a side of the titanium layer away from the substrate 10.

The present disclosure further provides a display module and a display device, wherein the display module and the display device each include the OLED display panel, and details are not described herein.

An OLED display panel according to the embodiment includes a substrate, a second metal layer, an anode layer, an electron transport layer, and a cathode layer, wherein the second metal layer is disposed on the substrate, the anode layer is disposed on a side of the second metal layer away from the substrate and includes an anode and an auxiliary electrode disposed in a same layer. The electron transport layer is disposed on a side of the anode layer away from the substrate, and the cathode layer is disposed on a side of the electron transport layer away from the substrate. The auxiliary electrode is disposed in an overlapping area and provided with a groove. An opening of the groove is toward the cathode layer, and the auxiliary electrode extends through the electron transport layer and is electrically connected with the cathode layer. By providing a groove on the side of the auxiliary electrode close to the cathode layer, the edge around the groove is formed with a scratching chamfer which facilitates the auxiliary electrode to extend through the electron transport layer and to contact with the cathode layer, thereby improving the conduction between the cathode layer and the auxiliary electrode. The technical problem that the conventional OLED display panel has a low yield when the electron transport layer covers the auxiliary electrode is alleviated. The mass production of the vapor deposition technology called one mask for Cathode/ET in the OLED display panel is feasible.

In the above-mentioned embodiments, the description of each embodiment has its own emphasis, and parts not described in detail in a certain embodiment may be referred to the related description of other embodiments.

The preparation method for OLED display panel and the OLED display panel provided in the embodiments of the present disclosure are described in detail, and the principles and embodiments of the present disclosure are described herein with specific examples. The description of the above embodiments is merely provided to help understand the method and the core idea of the present disclosure. At the same time, variations will occur to those skilled in the art in both the detailed description and the scope of disclosure in accordance with the teachings of the present disclosure. In conclusion, the present description should not be construed as limiting the disclosure.

What is claimed is:

1. An OLED display panel, comprising:

a substrate;

a second metal layer disposed on the substrate;

an anode layer disposed on a side of the second metal layer away from the substrate, wherein the anode layer includes an anode and an auxiliary electrode disposed in a same layer, and the auxiliary electrode is disposed in an overlapping area;

an electron transport layer disposed on a side of the anode layer away from the substrate; and a cathode layer disposed on a side of the electron transport layer away from the substrate;

wherein the auxiliary electrode is provided with grooves, an opening of the grooves is disposed toward the cathode layer, and the auxiliary electrode extends through the electron transport layer and is electrically connected to the cathode layer, and wherein the auxiliary electrode is disposed in a three-layer stacked structure, a cross section area of each layer of the three-layer stacked structure is decreased gradually in a direction away from the substrate, and the grooves are respectively provided in each layer of the three-layer stacked structure to form a scratching chamfer structure at an upper edge of each of the grooves.

2. The OLED display panel of claim 1, wherein the auxiliary electrode further comprises a first auxiliary electrode disposed in a non-display area and a second auxiliary electrode disposed in a display area, wherein the cathode layer is electrically connected to the second metal layer through the first auxiliary electrode in the non-display area, and the second auxiliary electrode is electrically connected to the cathode in parallel in the display area.

3. The OLED display panel of claim 2, wherein the first auxiliary electrode has at least one first scratching chamfer structure, and the second auxiliary electrode has at least one second scratching chamfer structure, wherein the first scratching chamfer structure contacts with the cathode layer, and the second scratching chamfer structure contacts with the cathode layer.

4. The OLED display panel of claim 3, wherein the first auxiliary electrode is provided in a grid shape or in a separated arc shape.

5. The OLED display panel of claim 3, wherein the first auxiliary electrode has a cross-section of trapezoidal shape, an angle is defined between at least one inclined side of the trapezoidal shape and the substrate, and the angle ranges from 75° to 90°.

6. The OLED display panel of claim 2, wherein the grooves comprise first grooves and second grooves, the first auxiliary electrode is provided with the first grooves, the second auxiliary electrode is provided with the second grooves, wherein a depth of the first grooves is less than or equal to a thickness of the first auxiliary electrode, and a depth of the second grooves is less than or equal to a thickness of the second auxiliary electrode.

7. The OLED display panel of claim 1, wherein the electron transport layer has a thickness of 10 nm to 20 nm.

8. The OLED display panel of claim 1, wherein the anode layer is disposed in a three-layer stacked structure.

9. A preparation method for OLED display panel, comprising:

providing a substrate;

preparing a second metal layer on the substrate;

coating at least one layer of conductive material on a side of the second metal layer away from the substrate, patterning the conductive material to prepare an anode layer, and preparing an electron transport layer and a cathode layer sequentially on a side of the anode layer away from the substrate, wherein the OLED display panel, comprising:

the substrate;

the second metal layer disposed on the substrate;

the anode layer disposed on a side of the second metal layer away from the substrate, wherein the anode layer includes an anode and an auxiliary electrode disposed in a same layer, and the auxiliary electrode is disposed in an overlapping area;

the electron transport layer disposed on a side of the anode layer away from the substrate; and the cathode layer disposed on a side of the electron transport layer away from the substrate;

wherein the auxiliary electrode is provided with grooves, an opening of the grooves is disposed toward the cathode layer, and the auxiliary electrode extends through the electron transport layer and is electrically connected to the cathode layer, and wherein the auxiliary electrode is disposed in a three-layer stacked structure, a cross section area of each layer of the three-layer stacked structure is decreased gradually in a direction away from the substrate, and the grooves are respectively provided in each layer of the three-layer stacked structure to form a scratching chamfer structure at an upper edge of each of the grooves.

10. The preparation method of claim 9, wherein the preparing an electron transport layer and the cathode layer sequentially on a side of the anode layer away from the substrate further comprises:

preparing the electron transport layer and the cathode layer via a same mask.

11. The preparation method of claim 9, the auxiliary electrode further comprises a first auxiliary electrode disposed in a non-display area and a second auxiliary electrode disposed in a display area, wherein the cathode layer is electrically connected to the second metal layer through the first auxiliary electrode in the non-display area, and the second auxiliary electrode is electrically connected to the cathode in parallel in the display area.

12. The preparation method of claim 11, wherein the first auxiliary electrode has at least one first scratching chamfer structure, and the second auxiliary electrode has at least one second scratching chamfer structure, wherein the first scratching chamfer structure contacts with the cathode layer, and the second scratching chamfer structure contacts with the cathode layer.

13. The preparation method of claim 12, wherein the first auxiliary electrode is provided in a grid shape or in a separated arc shape.

14. The preparation method of claim 12, wherein the first auxiliary electrode has a cross-section of trapezoidal shape, an angle is defined between at least one inclined side of the trapezoidal shape and the substrate, and the angle ranges from 75° to 90°.

15. The preparation method of claim 11, wherein the grooves comprise first grooves and second grooves, the first auxiliary electrode is provided with the first grooves, the second auxiliary electrode is provided with the second grooves, wherein a depth of the first grooves is less than or equal to a thickness of the first auxiliary electrode, and a depth of the second grooves is less than or equal to a thickness of the second auxiliary electrode.

16. The preparation method of claim 9, wherein the electron transport layer has a thickness of 10 nm to 20 nm.

17. The preparation method of claim 9, wherein the anode layer is disposed in a three-layer stacked structure.

* * * * *